United States Patent [19]
Toyoda

[11] 4,322,820
[45] Mar. 30, 1982

[54] SEMICONDUCTOR INTEGRATED CIRCUIT DEVICE

[75] Inventor: Kazuhiro Toyoda, Yokohama, Japan

[73] Assignee: Fujitsu Limited, Kawasaki, Japan

[21] Appl. No.: 171,276

[22] Filed: Jul. 23, 1980

[30] Foreign Application Priority Data

Jul. 26, 1979 [JP] Japan ................................. 54/95347

[51] Int. Cl.³ .......................................... G11C 11/40
[52] U.S. Cl. ................................... 365/154; 365/189; 365/190
[58] Field of Search ................ 365/154, 189, 174, 190

[56] References Cited

U.S. PATENT DOCUMENTS

4,209,851  6/1980  Ponder ............................. 365/154

OTHER PUBLICATIONS

IEEE Transaction on Electron Devices, vol. ED-26, No. 6, Jun. 1979, pp. 886-892, by Kawarada et al.

*Primary Examiner*—Terrell W. Fears

[57] ABSTRACT

An integrated injection logic ($I^2L$) memory, where the potential of the bit line of the lower potential selected bit line pair is changed, in response to the read or write mode, and so that the difference in potential between the selected bit line pair during the read mode becomes small.

9 Claims, 14 Drawing Figures

SEMICONDUCTOR INTEGRATED CIRCUIT DEVICE

BACKGROUND OF THE INVENTION

The present invention relates to a semiconductor device and, more particularly, to a semiconductor integrated circuit device in which memory cells are of an I²L (which is an abbreviation for Integrated Injection Logic) type.

In general, each of the memory cells of a bipolar memory device comprises a pair of load transistors connected to one word line, and a pair of cross-coupled transistors, connected to the load transistors, to one hold line, and to a pair of bit lines, which serve as a flip-flop. In the bipolar memory cells, the resistance value of the load resistors is designed to be very large so as to reduce the power consumption thereof. Therefore, the area of the load resistors occupied in a chip is very large and, in addition, isolation between the cross-coupled transistors is required. Consequently, the bipolar memory cells are large in size, which results in low integration density and a corresponding high manufacturing cost of the bipolar memory device.

In recent years, an I²L memory device has been developed. In an I²L memory cell, a pair of load transistors which serve as injectors are used instead of the above-mentioned large load resistors and, to moreover, no isolation between transistors within a row is required. As a result, high integration density and low manufacturing cost can be attained. It should be noted that such an I²L memory device can be manufactured by using conventional bipolar technology.

Usually, one I²L memory cell comprises first and second transistors of a first conduction type, (such as a pnp), which serve as injectors, cross-coupled third and fourth transistors of a second conduction type, (such as an npn), which serve as a flip-flop, and fifth and sixth transistors of the second conduction type for detecting and reversing the state of the flip-flop, in the read and write mode respectively. The third and fourth transistor are always in the reverse conducting mode, in other words, the emitters and collectors of these transistors are used as collectors and emitters, respectively. In addition, when the memory cell is non-selected, the fifth and sixth transistors are also in the reverse conducting mode. Contrary to this, when the memory cell is selected, the fifth and sixth transistors are in the forward conducting mode.

In the above-mentioned I²L memory cell, one of the third and fourth transistors is conductive, while the other is non-conductive. If the third transistor is conductive, injection currents of the first and second transistors are supplied to the collector and base of the third transistor, respectively. In order to change the cell information, the third transistor must be made non-conductive. This is done by supplying an emitter current larger than a write threshold current $I_{wth}$, and thus bypassing the base current of the third transistor to the base current of the fifth transistor parallel to the third transistor. In this case, the write threshold current $I_{wth}$ depends on the total injection current $I_{inj}$ which flows through a common emitter of the first and second transistors. In other words, when the injection current $I_{inj}$ is large, the write threshold current $I_{wth}$ is large.

On the other hand, sink currents, which are explained below, flow from a selected memory cell to non-selected memory cells. The sink currents increase the injection current $I_{inj}$ of the selected memory cell and, accordingly, increase the write threshold current $I_{wth}$, so that the speed of the write operation becomes slow.

In order to decrease the sink currents flowing from a selected memory cell into non-selected memory cells, one conventional I²L memory device comprises a clamp circuit. The clamp circuit comprises a plurality of pairs of clamp transistors, pair being connected to one of the pairs of bit lines. In the write mode, a high voltage is applied to the bases of the clamp transistors, so that sink currents flow into non-selected memory cells from the clamp transistors.

However, in a selected column of the above-mentioned conventional device (i.e. the column) in which a pair of bit lines are selected), since a write current $I_w$ is usually much larger than a sink current $I_s$ or a read current $I_R$, the difference in potential between the selected pair of bit lines is also much larger during the read mode than during the write mode. Therefore, since the speed of the read operation depends on the difference in potential between the selected bit lines, the speed of the read operation of the above-mentioned device becomes slow.

SUMMARY OF THE INVENTION

It is a principal object of the present invention to provide a semiconductor integrated circuit device of an I²L type with high read operation speed.

According to the present invention, there is provided a semiconductor integrated circuit device comprising: a plurality of word lines; a plurality of word drivers, each connected to one of the words lines; a plurality of hold lines; a plurality of pairs of bit lines; a plurality of bit drivers, each connected to one of the pairs of bit lines; a plurality of memory cells of integrated injection logic, each connected to one of the word lines, to one of the hold lines, and to one pairs of bit lines, and; means for selectively altering the lower one of the two potentials of a selected pair of bit lines in response to the read mode and the write mode, the lower potential during the read mode being higher than during the write mode. In this device, the difference in potential between selected bit lines during the read mode is smaller than in the conventional device, so that the speed of read operation becomes high.

BRIEF DESCRIPTION OF DRAWINGS

The present invention will be more clearly understood from the following description with reference to the accompanying drawings, wherein.

DESCRIPTION OF THE PREFERRED EMBODIMENTS

Figure 1:
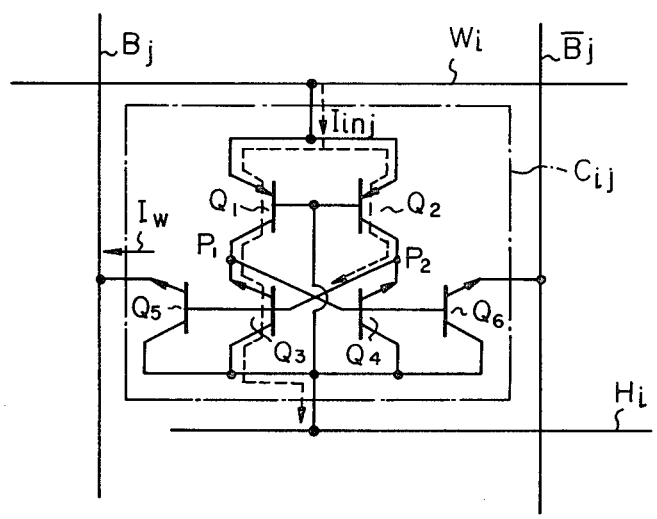
FIG. 1 is a circuit diagram illustrating an equivalent circuit of one I²L memory cell.

Referring to FIG. 1, which illustrates an equivalent circuit of one I²L memory cell, a memory cell $C_{ij}$ comprises a pair of pnp transistors $Q_1$ and $Q_2$ which serve as injectors, a pair of pnp transistors $Q_3$ and $Q_4$ which are cross-coupled to each other and serve as a flip-flop, and a pair of pnp transistors $Q_5$ and $Q_6$ for detecting and for reversing the state of the flip-flop, in the read and write mode respectively. The transistors $Q_1$ and $Q_2$ have a common emitter connected to a word line $W_i$ and collectors connected to collectors (which are represented as emitters in FIG. 1) of the transistors $Q_3$ and $Q_4$, respectively. The bases of the transistors $Q_1$ and $Q_2$, the emitters of the transistors $Q_3$ and $Q_4$, and the collectors of the transistors $Q_5$ and $Q_6$ are connected to a common hold line $H_i$. In addition, the emitters of the transistors $Q_5$ and $Q_6$ are connected to bit lines $B_j$ and $\overline{B}_j$, respectively.

The selection of the memory cell $C_{ij}$ is effected by raising the potential of the word line $W_i$ and by connecting the bit lines $B_j$ and $\overline{B}_j$ to data bit lines (not shown), to which current sources (not shown) are connected. The transistors $Q_3$ and $Q_4$ are in the reverse conducting mode, regardless of the selected or non-selected state of the memory cell $C_{ij}$. Contrary to this, the transistors $Q_5$ and $Q_6$ are in the forward conducting mode during the selected state of the memory cell $C_{ij}$, while the transistors $Q_5$ and $Q_6$ are in the reverse conducting mode during the nonselected state of the memory cell $C_{ij}$.

In FIG. 1, the transistors $Q_3$ and $Q_4$ are placed in the on and off state alternately. For example, when the transistor $Q_3$ is conductive, an injection current $I_{inj}$ is supplied to the transistor $Q_3$ as a base current and a collector current through the transistors $Q_1$ and $Q_2$, respectively. As a result, the transistor $Q_3$ is in a saturated state, so that the potential at $P_1$ is low and, accordingly, the transistor $Q_4$ is non-conductive. In order to change the information stored in the memory cell $C_{ij}$, the transistor $Q_3$ should be changed from conductive to non-conductive. This is done by supplying a write current $I_W$ larger than a write threshold current $I_{wth}$ to the emitter of the transistor $Q_5$, so that the base of the transistor $Q_5$ absorbs the base current of the transistor $Q_3$. As a result, the transistor $Q_3$ is changed from a saturated state to a non-saturated state, so that the potential at $P_1$ becomes high. Therefore, the transistor $Q_4$ becomes conductive and the potential at $P_2$ becomes low, so that the transistor $Q_3$ becomes non-conductive. That is, the state of the flip-flop formed by the transistors $Q_3$ and $Q_4$ is reversed.

In the above-mentioned write mode, the write threshold current $I_{wth}$ depends on the injection current $I_{inj}$. Therefore, the write threshold current $I_{wth}$ is large where the injection current $I_{inj}$ is large.

Figure 2:
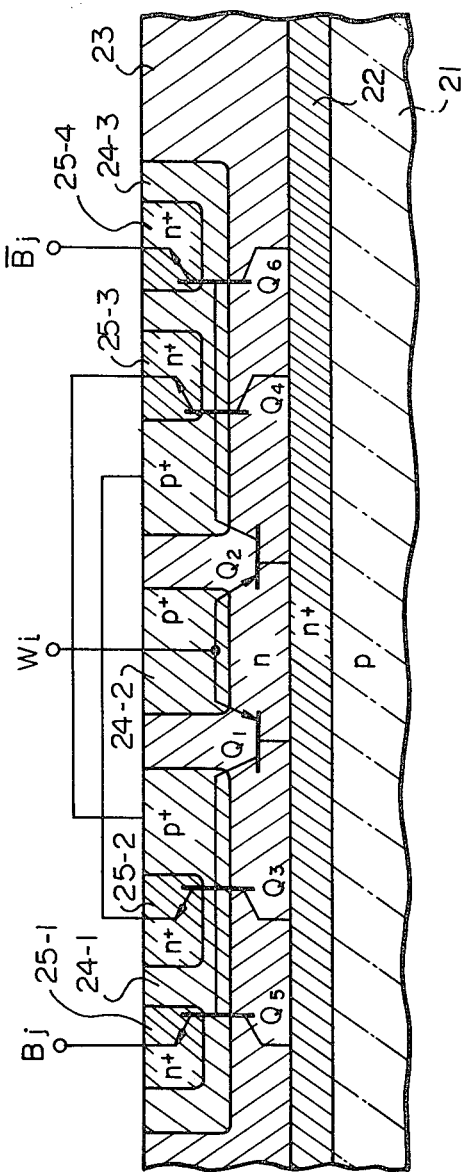
FIG. 2 is a cross-sectional view of the I²L memory cell of FIG. 1.

FIG. 2 is a cross-sectional view of the I²L memory cell of FIG. 1. In FIG. 2, an n+-type buried layer 22, which serves as the hold line $H_i$ (FIG. 1), is formed in a p-type substrate 21 by using conventional diffusion technology. In addition, an n-type epitaxial layer 23 is formed on the buried layer 22 by using epitaxial technology. Further, in the epitaxial layer 23, p+-type diffusion layers 24-1, 24-2 and 24-3 are formed, and, in addition, in the p+-type diffusion layers 24-1, 24-2, and 24-3, n+-type diffusion layers 25-1, 25-2, 25-3 and, 25-4 are formed by using conventional diffusion technology. As illustrated in FIG. 2, the injection transistors $Q_1$ and $Q_2$ are of a lateral type, while the transistors $Q_3$ and $Q_5$ (like $Q_4$ and $Q_6$) are both formed by one vertical transistor with multiple collectors (shown as emitters). In the memory cell of FIG. 2, it should be noted that there is no resistor of high resistance and no isolation between the transistors $Q_1$ through $Q_6$, so that the memory cells can be formed in a high density.

Figure 3A:
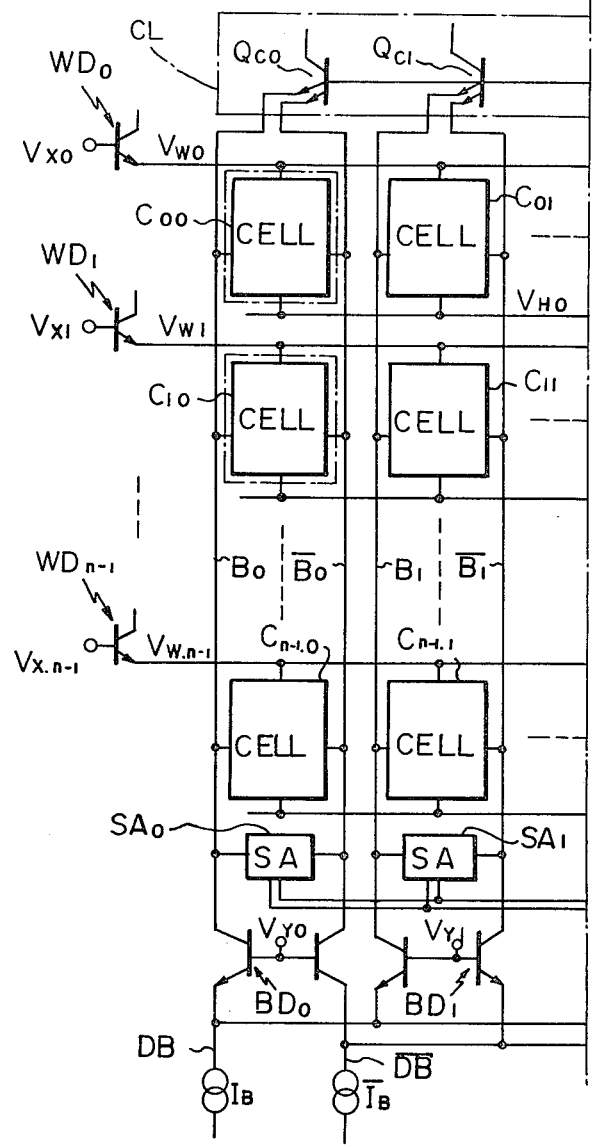
FIG. 3 is a block diagram illustrating a conventional I²L memory device.
Figure 3B:
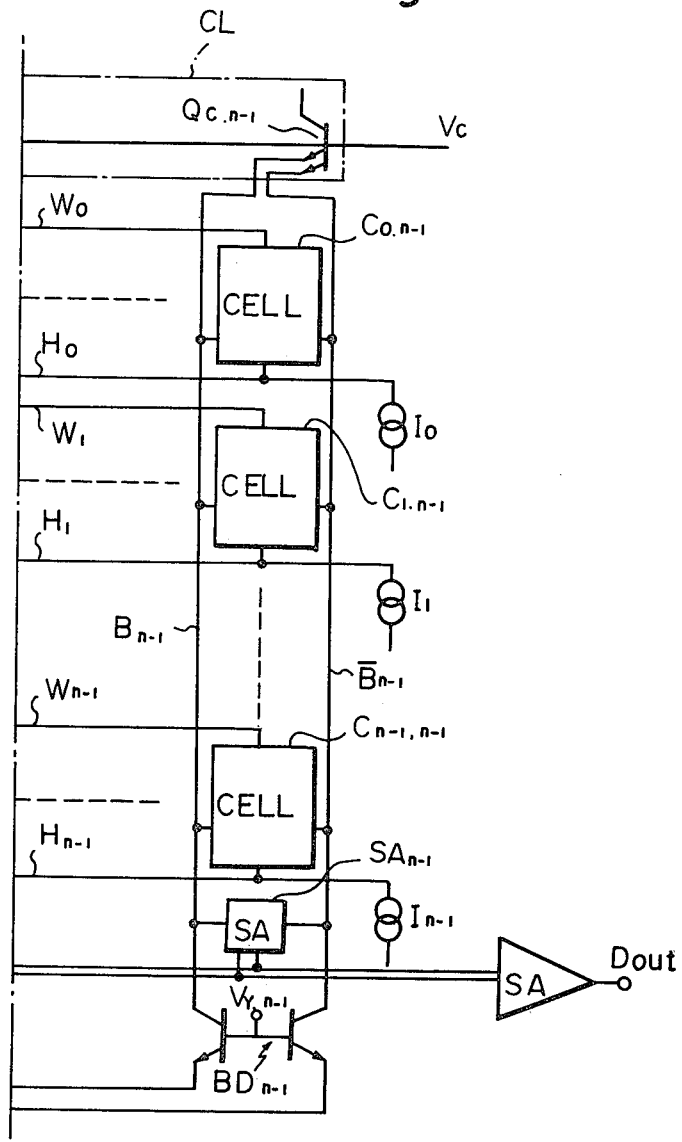

FIG. 3 is a block diagram illustrating a conventional I²L memory device. In FIG. 3, a memory array comprised of memory cells $C_{ij}$ (i, j = 0, 1, ..., n-1), which are arranged in an n row by n column matrix, is shown. Each of the memory cells $C_{ij}$ can be selected by supplying a row selection signal $V_{X0}$ through $V_{X,n-1}$ to a word decoder $WD_0$ through $WD_{n-1}$ and by supplying a column selection signals $V_{Y0}$ through $V_{Y,n-1}$ to a bit driver $BD_0$ through $BD_{n-1}$. Sense amplifiers $SA_0, ..., SA_{n-1}$ detect the data stored in the memory cells.

In the above-mentioned device, a clamp circuit CL is provided so as to supply sink currents into non-selected memory cells. Therefore, an injection current in a selected memory cell can be stable. For example, when the potentials of only the signals $V_{X0}$ and $V_{Y0}$ are high, the memory cell $C_{00}$ is selected and the memory cells $C_{01}, C_{02}, ..., C_{0,n-1}$, which belong to the word line $W_0$, are half-selected. In addition, the other memory cells are non-selected. The clamp voltage $V_C$ of the clamp circuit CL should be determined between two values which will now be explained.

Figure 4:
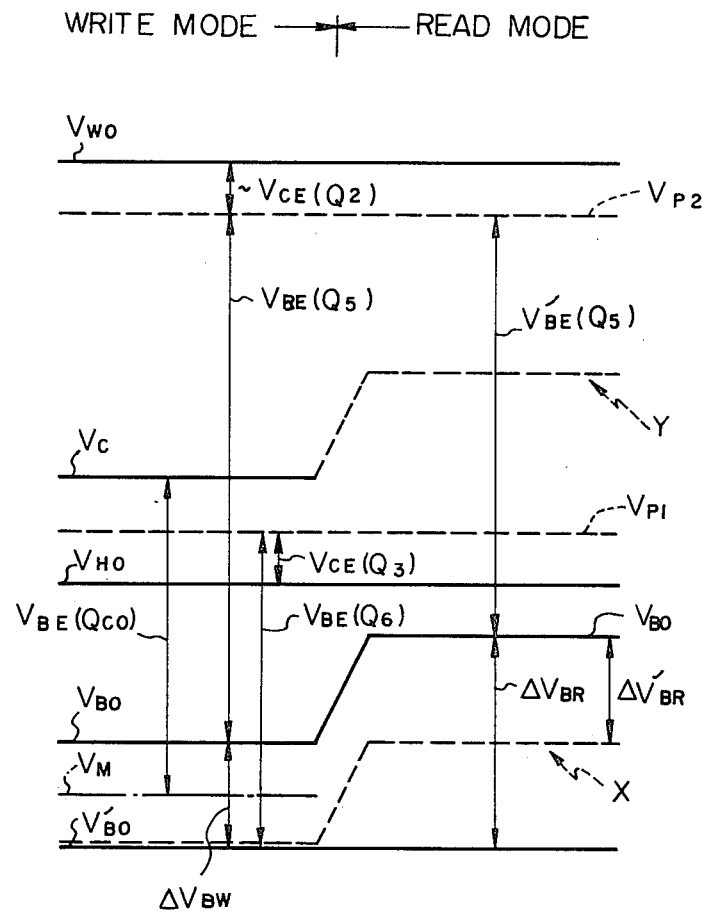
FIG. 4 is a diagram showing potential levels, for explaining the proper value of the clamp voltage $V_c$ of the clamp circuit CL of FIG. 3.

FIG. 4 is a diagram showing potential levels, for explaining the value of the clamp voltage $V_C$ of the clamp circuit CL of FIG. 3. In FIG. 4, $V_{W0}$ and $V_{H0}$ indicate the potentials of the word line $W_0$ and the hold line $H_0$, and $V_{P1}$ and $V_{P2}$ indicate the potentials at points $P_1$ and $P_2$ respectively (see, FIG. 1) of the memory cell $C_{00}$, which potentials are represented as follows.

$$V_{P1} = V_{H0} + V_{CE}(Q_3)$$

$$V_{P2} = V_{W0} - V_{CE}(Q_2)$$

where $V_{CE}(Q_3)$ and $V_{CE}(Q_2)$ are collector-emitter voltage of the transistors $Q_3$ and $Q_2$ (FIG. 1), respectively. In this case, the transistors $Q_3$ and $Q_4$ (FIG. 1) of the cell $C_{00}$ are conductive and non-conductive, respectively.

In addition, in the write mode, the potential $V_{B0}$ of the bit line $B_0$ should satisfy the following formula, so that the write current $I_W$ can flow from the transistor $Q_5$ (FIG. 1) into the bit line $B_0$.

$$V_{B0} \leq V_{P2} - V_{BE}(Q_5)$$

where $V_{BE}(Q_5)$ is a base-emitter voltae of the transistor $Q_5$.

On the other hand, the potential $V_{B0}'$ of the bit line $\overline{B}_0$ should satisfy the following formula, so that no sink current can flow from the transistor $Q_6$ (FIG. 1) of the selected cell $C_{00}$ to non-selected memory cells.

$$V_{B0}' \geq V_{P1} - V_{BE}(Q_6)$$

where $V_{BE}(Q_6)$ is a base-emitter voltage of the transistor $Q_6$.

Therefore, for example, the clamp voltage $V_C$ is caused to be $V_M + V_{BE}(Q_{C0})$, where $V_M$ is $(V_{B0} - V_{B0}')/2$ and $V_{BE}(Q_{C0})$ is a base-emitter voltage of a multi-emitter transistor $Q_{C0}$ of the clamp circuit CL.

Contrary to above, in the read mode, a read current $I_R$ or a sink current $I_S$, which is much smaller than the write current $I_W$, flows through the transistor $Q_5$, so that the base-emitter voltage $V_{BE}'(Q_5)$ of the transistor $Q_5$ in the read mode is much smaller than the base-emitter voltage $V_{BE}(Q_5)$ of the transistor $Q_5$ in the write mode. Therefore, the difference $\Delta V_{BR}$ in the read mode is much larger than the difference $\Delta V_{BW}$, which results in a deterioration of the read operation. The read operation will now be explained.

Figure 5:
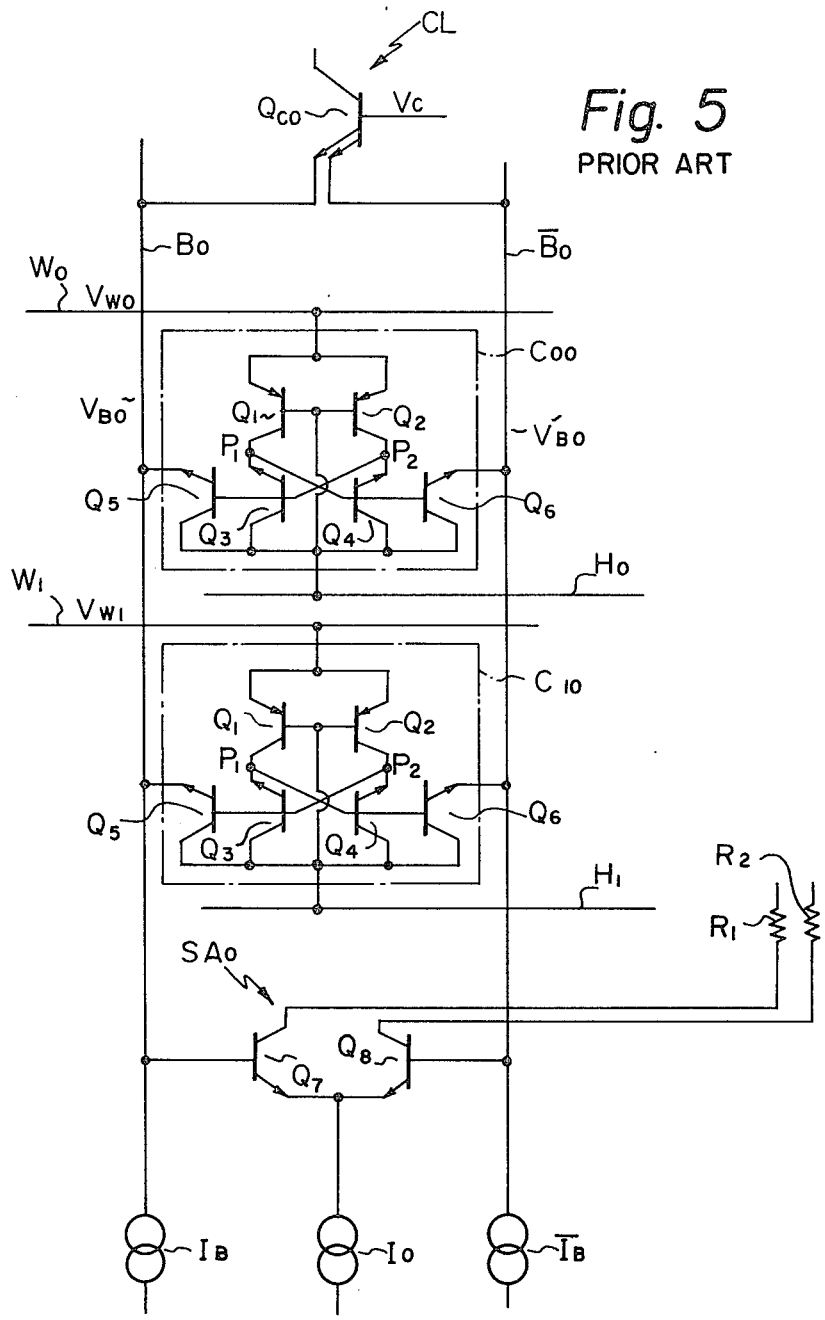
FIG. 5 is a circuit diagram of the memory cells $C_{00}$ and $C_{10}$ of FIG. 3, for explaining the read operation of the device of FIG. 3.
Figure 6:
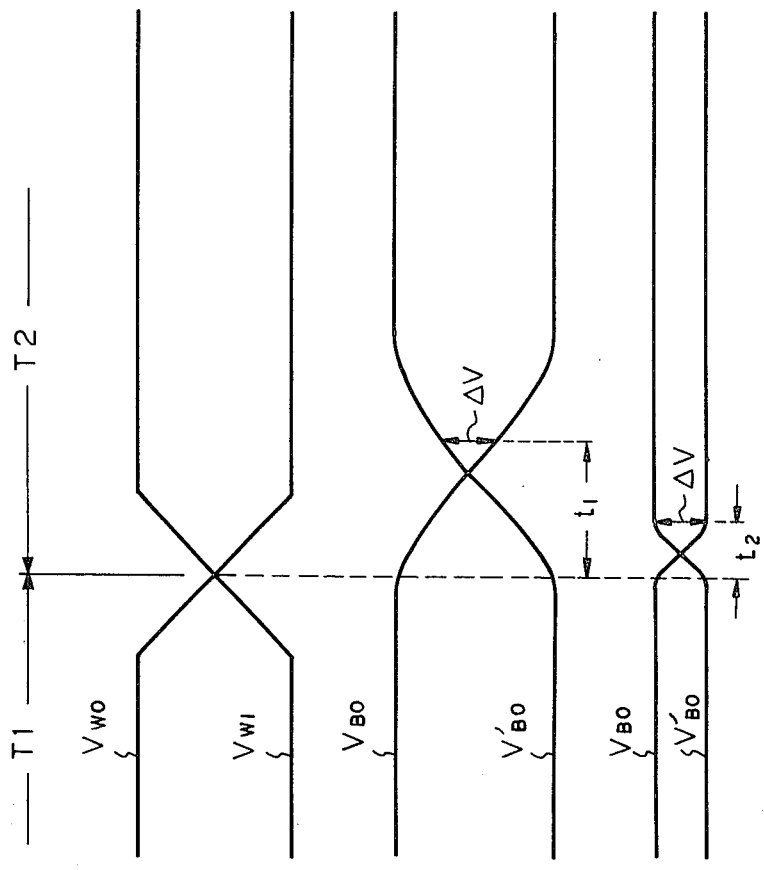
FIGS. 6A and 6B are timing diagrams of the signals appearing in the circuit of FIG. 5.
FIG. 6C is a timing diagram of signals appearing in the present invention, corresponding to FIG. 6B.

FIG. 5 is a circuit diagram of the memory cells $C_{00}$ and $C_{10}$ of FIG. 4, for explaining the read operation of the device of FIG. 4, and FIGS. 6A and 6B are timing diagrams of the signals appearing in the circuit of FIG. 5. In FIG. 5, for a period T1, as shown in FIGS. 6A and 6B, voltages $V_{W0}$ and $V_{W1}$ of the word lines $W_0$ and $W_1$ are high and low, respectively, that is, the memory cells $C_{00}$ and $C_{10}$ are respectively selected and non-selected. In addition, in the memory cell $C_{00}$, the transistor $Q_3$ is conductive, while in the memory cell $C_{10}$, the transistor $Q_4$ is conductive. The difference in potential between the bit lines $B_0$ and $\overline{B_0}$, which difference is, for example, 0.8 volt, as illustrated in FIG. 6B, is detected by a differential read-out circuit $SA_0$ formed by two transistors $Q_7$ and $Q_8$. In addition, the detected currents $I_O$ are transformed to voltages by resistors $R_1$ and $R_2$, and the voltages are supplied to an output circuit (not shown).

When the memory cell $C_{00}$ is changed from selected to non-selected and the memory cell $C_{10}$ is simultaneously changed from non-selected to selected, that is, when the voltage $V_{W0}$ is changed from high to low and the voltage $V_{W1}$ is simultaneously changed from low to high, as illustrated in FIG. 6A, the voltages $V_{B0}$ and $V_{B0}'$ are changed (i.e.) to low and high, respectively. Since the minimum difference $\Delta V$ which ca be detected by the differential read-out circuit $SA_0$ is small, for example, 0.2 volt, it takes a time $t_1$ for the circuit $SA_0$ to detect the difference in potential between the two bit lines $B_0$ and $\overline{B_0}$. In particular, in a large-scale integrated memory device, bit lines to which a large number of memory cells are connected have large stray capacitances, so that the time $t_1$ in FIG. 6B becomes long and, accordingly, the speed of the read operation becomes slow.

In the present invention, the difference in potential between the bit lines during the read mode is almost the same as during the write mode. Therefore, the read-out time according to the present invention, which corresponds to the time $t_2$ in FIG. 6C, becomes shorter than that of the conventional device, which corresponds to the time $t_1$.

It should be noted that the higher one of the two potentials of the selected bit lines is determined by the potential of the selected word line, and accordingly, the higher potential cannot be changed. Therefore, in the present invention, the lower of the two potentials of the selected bit lines is changed in response to the write mode or the read mode, which is illustrated by a dotted line X in FIG. 4, in which the difference $\Delta V'_{BR}$ is smaller than the difference $\Delta V_{BR}$.

Figure 7:
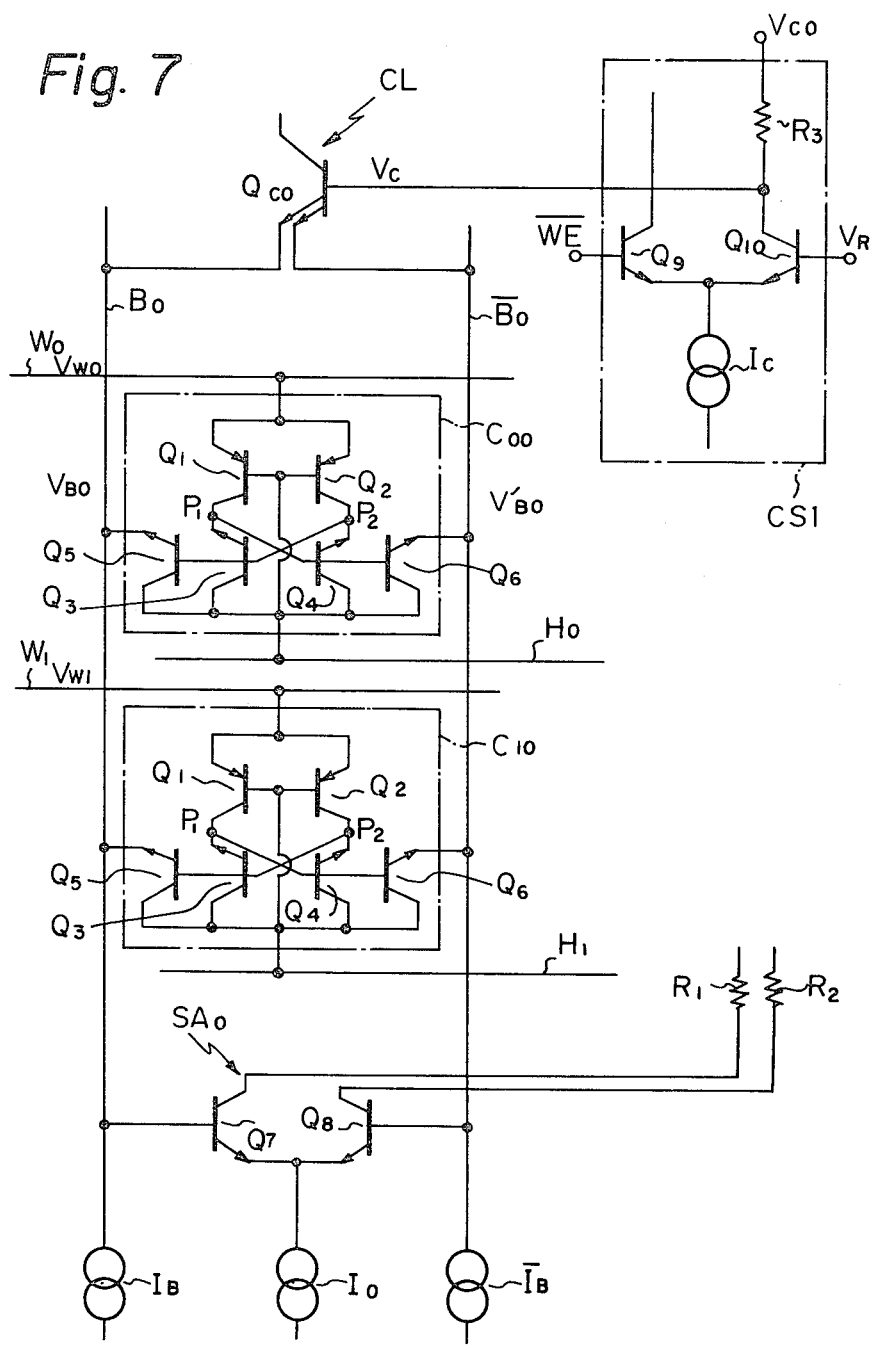
FIGS. 7 and 8 are circuit diagrams illustrating first and second embodiments of the I²L memory device according to the present invention.

FIG. 7 is a circuit diagram illustrating a first embodiment of the I²L memory device according to the present invention. The elements illustrated in FIG. 7 which are identical to those of FIG. 5 are denoted by the same reference numerals. In FIG. 7, a current switching circuit CS1 which is comprised of a current switch formed by two transistors $Q_9$ and $Q_{10}$ is provided for controlling the clamp voltage $V_C$ of the clamp circuit CL. The transistors $Q_9$ and $Q_{10}$ are connected to a current source $I_C$ whose value is also represented by $I_C$, and in addition, the transistor $Q_{10}$ is connected to a resistor $R_3$. During the write mode, since the potential of an inverted write enable signal $\overline{WE}$ is lower than reference voltage $V_R$, the transistor $Q_{10}$ is conductive, and accordingly, the current $I_C$ flows through the resistor $R_3$. As a result, the clamp voltage $V_C$ becomes low. Therefore, the potentials $V_{B0}$ and $V'_{B0}$ are as illustrated in the left side portion of FIG. 4. Contrary to this, during the read mode, since the potential of the signal $\overline{WE}$ is higher than the reference voltage $V_R$, the transistor $Q_9$ is conductive, and accordingly, the voltage $V_C$ becomes equal to $V_{C0}$ which is high, as illustrated in the right side portion of FIG. 4. As a result, the lower potential $V'_{B0}$ of the two selected bit lines is higher during the read mode than during the write mode. It should be noted that the potential $V_{B0}$ is changed in response to whether a write current or a read current flows through the transistor $Q_5$, not in response to the clamp voltage $V_C$.

Figure 8:
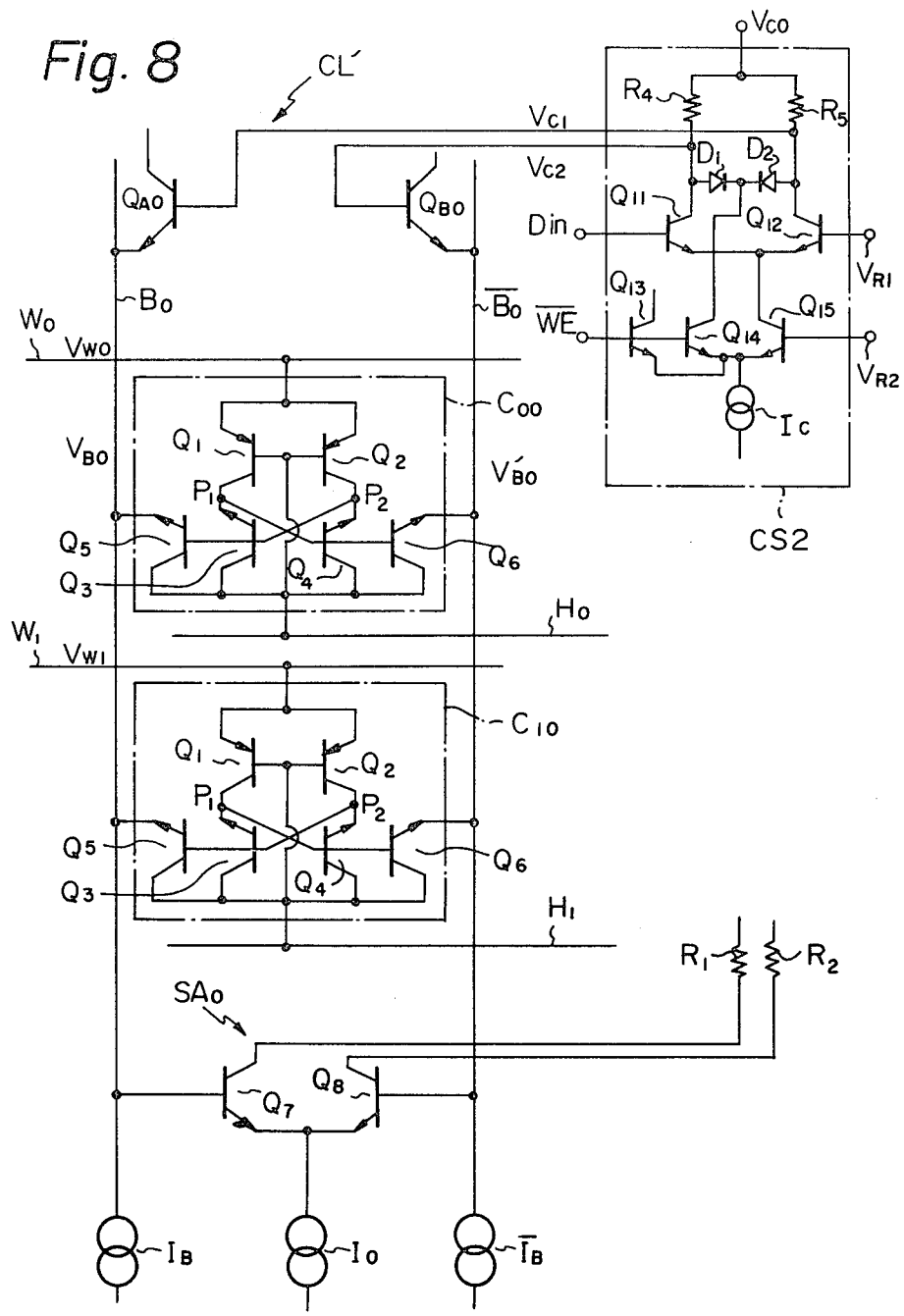
Figure 9:
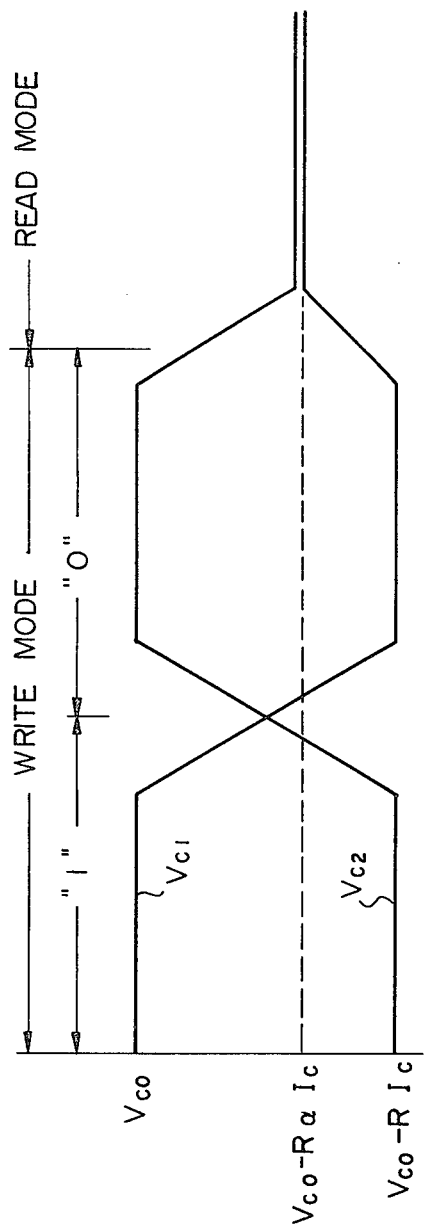
FIG. 9 is a timing diagram of the signals appearing in the device of FIG. 8.

FIG. 8 is a circuit diagram illustrating a second embodiment of the I²L memory device according to the present invention. The elements in FIG. 8 which are identical to those of FIG. 5 are denoted by the same reference numerals. In FIG. 8, a current switching circuit CS2, which is comprised of two current switches, is provided for controlling clamp voltages $V_{C1}$ and $V_{C2}$ of a clamp circuit CL' formed by transistors $Q_{A0}$ and $Q_{B0}$. The transistors $Q_{11}$ and $Q_{12}$ are connected by an input data signal $D_{in}$ and a reference voltage $V_{R1}$, respectively, while the transistors $Q_{13}$, $Q_{14}$, and $Q_{15}$ are connected by the signal $\overline{WE}$ and a reference voltage $V_{R2}$. In addition, transistors $Q_{11}$ and $Q_{12}$ are connected to resistors $R_4$ and $R_5$, respectively, and to diodes $D_1$ and $D_2$, respectively, which diodes are connected in series to each other with opposite conducting directions. Further, the connection point between the diodes $D_1$ and $D_2$ is connected to the transistor $Q_{14}$. During the write mode, since the signal $\overline{WE}$ is lower than the reference voltage $V_{R2}$, the transistor $Q_{15}$ is conductive. In addition, when the write data is "1", that is, when the potential of the signal $D_{in}$ is higher than the reference voltage $V_{R1}$, the transistor $Q_{11}$ is conductive, and accordingly the current $I_C$ flows through the resistor $R_4$, and the transistors $Q_{11}$ and $Q_{15}$. Therefore, the voltages $V_{C1}$ and $V_{C2}$ are high and low respectively, as illustrated in FIG. 9. when the write data is "0", that is, when the potential of the signal $D_{in}$ is lower than the reference voltage $V_{R1}$, the transistor $Q_{12}$ is conductive, and accordingly, the current $I_C$ flows through the resistor $R_5$, and the transistor $Q_{12}$ and $Q_{15}$. Therefore, the voltages $V_{C1}$ and $V_{C2}$ are low and high, respectively, as illustrated in FIG. 9.

In the read mode, since the potential of the signal $\overline{WE}$ is higher than the reference voltage $V_{R2}$, the transistors $Q_{13}$ and $Q_{14}$ are conductive, so that the current $I_C$ is divided by the transistors $Q_{13}$ and $Q_{14}$. In addition, the current flowing through the transistor $Q_{14}$ is divided by the diodes $D_1$ and $D_2$. In this case, the voltage $V_{C1}$ ($=V_{C2}$) is represented as follows.

$$V_{C1}(=V_{C2}) = V_{C0} - R\alpha I_C$$

$$\alpha = \frac{A_{14}}{A_{13} + A_{14}}$$

where R is the resistance value of the resistors $R_4$ or $R_5$, and $A_{13}$ and $A_{14}$ are emitter areas of the transistors $Q_{13}$ and $Q_{14}$ respectively. Therefore, the voltages $V_{C1}$ and $V_{C2}$ during the read mode can be higher than the lower one of the voltages $V_{C1}$ and $V_{C2}$ during the write mode, by adjusting the emitter areas of the transistor $Q_{13}$ and $Q_{14}$. As a result, the lower potential $V'_{B0}$ of the selected bit lines is higher during the read mode than during the write mode.

Figure 10A:
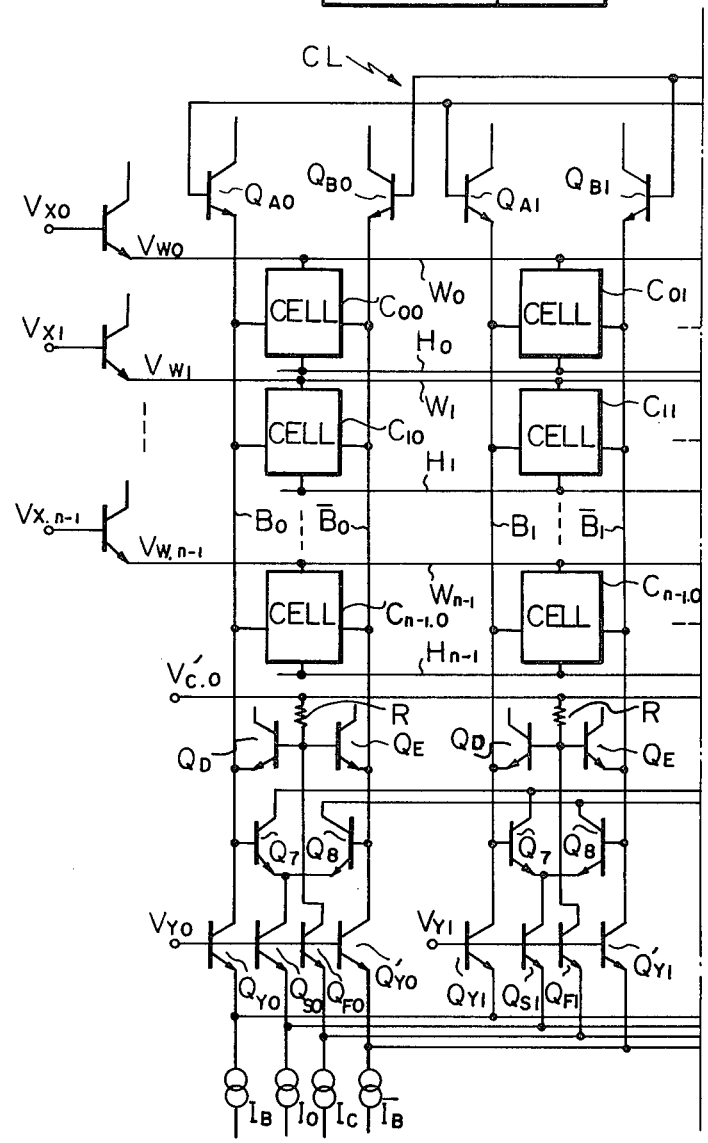
FIG. 10 is a circuit diagram of a third embodiment of the I²L memory device according to the present invention.
Figure 10B:
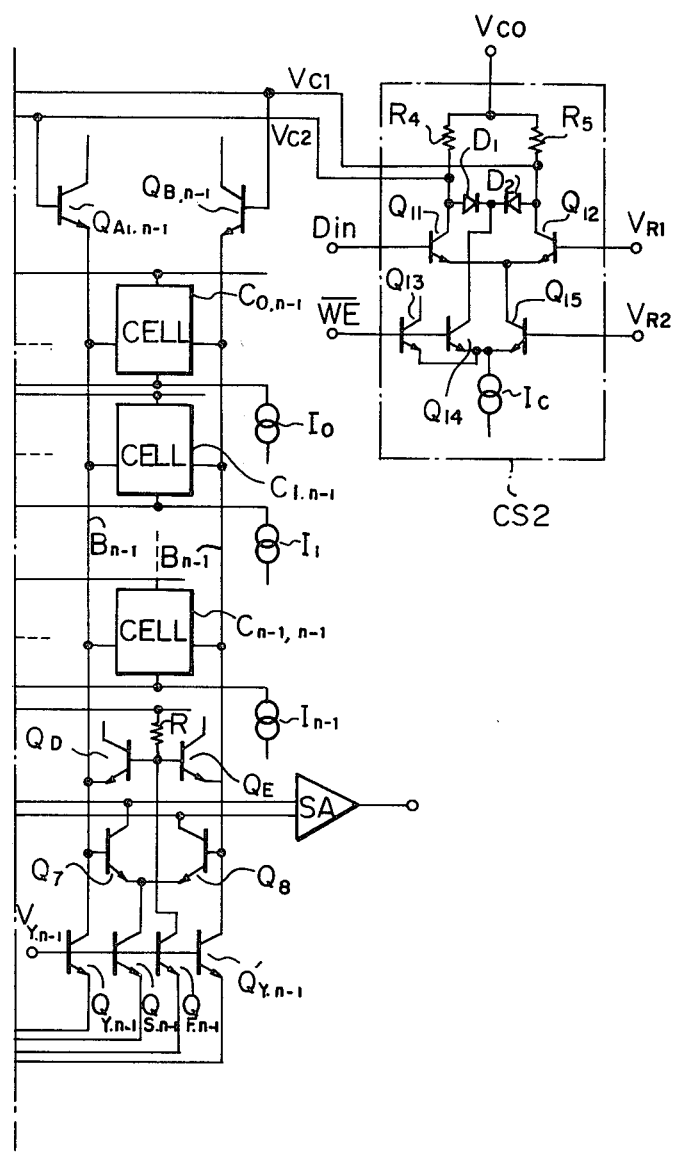

FIG. 10 is a circuit diagram illustrating a third embodiment of the I²L memory device according to the present invention. In FIG. 10, memory cells are arranged in an n row by n column matrix form. In addition, in each column, an additional clamp circuit comprising two transistors $Q_D$ and $Q_E$ connected to the bit line pair, a resistor R connected to the bases of the transistors $Q_D$ and $Q_E$, and a switching transistor $Q_{si}$ (i=0, 1,-, n-1) is provided. For example, when the potentials of the signals $V_{X0}$ and $V_{Y0}$ are high, in other words, when the memory cell $C_{00}$ is selected, transistors $Q_{Y0}$ and $Q'_{Y0}$ which form a bit driver, the transistor $Q_{S0}$ for driving the differential read-out circuit formed by the transistors $Q_7$ and $Q_8$, and a transistor $Q_{F0}$ for driving the additional clamp circuit are conductive, while the other transistors $Q_{Y1}$, $Q_{Y2}$,-, $Q'_{Y1}$, $Q'_{Y2}$,-, $Q_{Y,n-1}$; $Q_{S1}$, $Q_{S2}$,-, $Q_{S,n-1}$; $Q_{F1}$, $Q_{F2}$,-, $Q_{F,n-1}$ are non-conductive. As a result, a high voltage $V'_{C0}$ is applied to the bases of the transistors $Q_D$ and $Q_E$ of the 1st, 2nd,-, (n-1)th columns, so that the potentials of the bit lines $\overline{B}_1$, $B_1$, $B_2$, $\overline{B}_2$,-, $B_{n-1}$, $\overline{B}_{n-1}$ are high, regardless of the operation of the current switching circuit CS2. Therefore, sink currents of non-selected memory cells which are not connected to the selected word line $W_0$ and the selected bit lines $B_0$ and $\overline{B}_0$ are supplied from the transistors $Q_{D1}$, $Q_{E1}$, $Q_{D2}$, $Q_{E2}$, $Q_{D,n-1}$, $Q_{E,n-1}$.

As explained hereinbefore, the semiconductor integrated circuit device according to the present invention has the advantage that the speed of the read operation is high, since the difference in potential between the selected bit lines can be reduced as compared with that of the conventional device.

What is claimed is:

1. A semiconductor integrated circuit device, connected to receive an input data signal and an inverted write enable signal, a high or low level of said inverted write enable signal defining a read or write mode respectively, said device comprising:
   a plurality of word lines;
   a plurality of hold lines;
   a plurality of pairs of bit lines;
   a plurality of memory cells of integrated injection logic, each connected to one of said word lines, to one of said hold lines, and to one pair of said pairs of bit lines; and
   means for selectively altering the potential of the lower potential bit line of a selected pair of bit lines in response to the read or write mode, so that the potential of said lower potential bit line during the read mode is higher than during the write mode.

2. A device according to claim 1, wherein each of said memory cells comprises:
   injectors comprising first and second transistors of a first conduction type which have a common emitter connected to one of said word lines;
   a flip-flop comprising cross-coupled third and fourth transistors of a second conduction type, respectively connected to said first and second transistors; and
   fifth and sixth transistors, connected in parallel to said third and fourth transistors respectively, and to first and second bit lines respectively of said pair of bit lines;
   said third, fourth, fifth, and sixth transistors also being connected to one of said hold lines.

3. A device according to claim 1, wherein said selective altering means comprises:
   a plurality of multi-emitter transistors, the emitters of each said multi-emitter transistor being connected to one pair of said pairs of bit lines; and
   current switching means for selectively clamping the gates of said multi-emitter transistors in response to the write enable signal.

4. A devices according to claim 3, wherein said current switching of circuit comprises:
   means for providing a first reference voltage;
   a current switch comprising first and second transistors controlled by the inverted write enable signal and by said first reference voltage, respectively;
   a current source for supplying a current to said current switch; and
   a resistor connected to said second transistor;
   the base of said multi-emitter transistor being connected to said resistor.

5. A device according to claim 1, wherein said selective altering means comprises:
   a plurality of pairs of clamp transistors, each pair connected to one of said pairs of bit lines; and
   a current switching circuit for selectively clamping the bases of said clamp transistors in response to the write enable signal and the input data signal.

6. A device according to claim 5, wherein said current switching circuit comprises:
   means for providing first and second reference voltages;
   a first current switch comprising first and second transistors controlled by the input data signal and by said first reference voltage respectively;
   a second current switch comprising third, fourth and fifth transistors, said third and fourth transistors both being controlled by the inverted write enable signal, and said fifth transistor being controlled by said second reference voltage and being connected to said first current switch;
   a current source for supplying current to said second current switch;
   a pair of resistors connected to said first and second transistors respectively and to the bases of said pairs of clamp transistors; and
   a pair of diodes connected opposingly in series between said pair of resistors, the connection point between said diodes being connected to said thirteenth transistor.

7. The device of claim 4, further comprising means for providing a second reference voltage, said resistor being connected between said multi-emitter transistor and said second reference voltage.

8. The device of claim 6, further comprising means for providing a third reference voltage, said resistors being connected between said third reference voltage and said first and second transistors.

9. The device of claim 1, 5, 6, or 8, further comprising:
   a plurality of pairs of additional clamp transistors, each pair of additional clamp transistors being connected to one pair of said pairs of bit lines;
   a plurality of additional resistors, each additional resistor being connected commonly to the bases of both transistors of one of said pairs of additional clamp transistors; and
   a plurality of means, connected to respective ones of said additional resistors, for moving current through a particular one of said additional resistors whenever some one of the ones of said memory cells which are connected to the one pair of said bit line pairs corresponding to said particular additional resistor is selected.

* * * * *

UNITED STATES PATENT AND TRADEMARK OFFICE
CERTIFICATE OF CORRECTION

PATENT NO. : 4,322,820  
DATED : March 30, 1982  
INVENTOR(S) : Toyoda

Page 1 of 2

It is certified that error appears in the above-identified patent and that said Letters Patent are hereby corrected as shown below:

Front page, after "Primary Examiner -- Terrell W. Fears" insert --Attorney, Agent, or Firm -- Staas & Halsey--;
Front page, [57] Abstract, line 2, after "the" (first occurrence) insert --lower potential--; before "selected," delete "lower potential";
Front page, [57] Abstract, line 4, delete "and".
Column 1, line 23, "corresponding" should be --correspondingly--;
        line 35, delete "a" (second occurrence);
        line 36, delete "," (first occurrence);
        line 37, delete ",";
        line 38, delete "an"; delete "," (first occurrence);
        line 41, "transistor" should be --transistors--;
        line 60, delete "current"; "fifth" should be --fourth--.
Column 2, line 15, "are" should be --is--;
        line 33, "words" should be --word--;
        line 38, "pairs" should be --pair--; "lines, and;" should be --lines; and--;
        line 48, after "OF" insert --THE--;
Column 3, line 5, "8, and;" should be --8; and--;
        line 15, "pnp" should be --npn--;
        line 17, "pnp" should be --npn--.
Column 4, line 21, "v" (second occurrence) should be --V--;
        line 23, "signals" should be --signal--;
        line 42, "(see," should be --(see--;
        line 58, "$\leq$" should be --<--;
        line 60, "voltae" should be --voltage--.
Column 5, line 30, "$B_0$" (second occurrence) should be --$\bar{B}_0$--;
        line 42, "i.e." should be --e.g.--;
        line 43, "ca" should be --can--.
Column 6, line 39, "connected" should be --controlled--;
        line 57, "when" should be --When--.

UNITED STATES PATENT AND TRADEMARK OFFICE
CERTIFICATE OF CORRECTION

PATENT NO. : 4,322,820
DATED : March 30, 1982
INVENTOR(S) : Toyoda

It is certified that error appears in the above—identified patent and that said Letters Patent is hereby corrected as shown below:

Column 7, line 9, "resistors" should be --resistor--;
line 26, "-," should be --...,--;
line 33, delete "$Q_{Y2},-,$" and insert --$Q_{Y2},...,Q_{Y,n-1};$ --; delete "$Q'_{Y2},-, Q_{Y,n-1};$" and insert --$Q''_{Y2},... Q'_{Y,n-1};$ --; "$Q_{Y,n-1}$" should be --$Q'_{Y,n-1}$--;
line 34, "-," should be --...,-- (both occurrences);
line 36, "-," should be --...,--;
line 38, "$\bar{B}_1, B_1,$" should be --$B_1, \bar{B}_1,$--; "-," should be --...,--;
line 43, "$B_0$" (second occurrence) should be --$\bar{B}_0$--.

Signed and Sealed this

Thirty-first Day of August 1982

[SEAL]

Attest:

GERALD J. MOSSINGHOFF

Attesting Officer

Commissioner of Patents and Trademarks